United States Patent
Dobos

(10) Patent No.: US 6,384,657 B1
(45) Date of Patent: May 7, 2002

(54) PHASE STARTABLE CLOCK DEVICE HAVING IMPROVED STABILITY

(75) Inventor: Laszlo Dobos, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/799,786

(22) Filed: Mar. 5, 2001

(51) Int. Cl.[7] .............................................. G06F 1/04
(52) U.S. Cl. ..................................... 327/294; 327/233
(58) Field of Search ................................ 327/293, 294, 327/299, 171, 129, 231, 298, 291, 233

(56) References Cited

U.S. PATENT DOCUMENTS

| | | | |
|---|---|---|---|
| 5,084,681 A | * | 1/1992 | Kovalick et al. ............ 327/106 |
| 5,402,019 A | | 3/1995 | Drummond ................... 327/237 |
| 5,644,260 A | * | 7/1997 | DaSilva et al. ............... 327/238 |
| 5,701,393 A | * | 12/1997 | Smith, III et al. ........... 704/258 |
| 5,939,916 A | * | 8/1999 | Jamal et al. .................. 327/231 |
| 5,959,479 A | | 9/1999 | Woodward .................... 327/160 |
| 6,181,181 B1 | * | 1/2001 | Tsukahara et al. ........... 327/233 |
| 6,310,502 B1 | * | 10/2001 | Klier ............................ 327/231 |

* cited by examiner

Primary Examiner—Kenneth B. Wells
Assistant Examiner—Hai L. Nguyen
(74) Attorney, Agent, or Firm—William K. Bucher

(57) ABSTRACT

A phase stable clock circuit includes a phase gate having track-and-hold (T/H) circuits with each T/H circuit receiving a phase shifted continuous sinusoidal signal of predetermined phase and a control input signal to hold, at a selected time during the signal epoch of the respective sinusoidal signals, phase values of the sinusoidal signals. The respective phase values are coupled to an infinite track-and-hold circuit to generate replicas of the phase values. The phase values and the replica phase values are coupled to respective multiplexers that selectively couple the phase values to multipliers during a first time period and replica phase values during a second time period. The output of each multiplexer is coupled to a multiplier that receives one of the phase shifted continuous sinusoidal signals. The output of the multipliers are summed in a summing circuit to generate an output signal with a predetermined stable startup phase relative to the transition. The use of the infinite track-and-hold improves the long-term stability of the output signal from the summing circuit.

22 Claims, 4 Drawing Sheets

PHASE STARTABLE CLOCK DEVICE HAVING IMPROVED STABILITY

BACKGROUND OF THE INVENTION

The present invention relates generally to phase startable clock devices and more particularly to a phase startable clock device having improved stability.

In a high speed digitizing instrument, an analog input signal is sampled and quantized during an acquisition interval under control of a sampling strobe signal. The sampling strobe signal may be, or may be derived from, a high frequency sinusoidal signal. It may be desired that the high frequency sinusoidal signal start with a known phase at a fixed time following a control signal transition that is representative of a trigger event. It is known to generate such a high frequency sinusoidal signal using a circuit known as a phase startable clock.

U.S. Pat. No. 5,402,019 describes a phase startable clock device having improved jitter performance and minimal start-up time delay. FIG. 1 shows a generalized form of the phase startable clock device 10 having a stable oscillator 12 generating a sinusoidal signal. The sinusoidal signal is applied to phase splitters 14 and 16. The phase splitters 14 and 16 have gains A and B and phases α and β and shift the phases of the sinusoidal input signals relative to each other. Generally in a two phase splitter device, the sinusoidal signals are in quadrature phase or 90° apart. Matching of the gains A and B and having an exact quadrature relationship between the sinusoidal signals are not critical for operation of the device. Each phase shifted sinusoidal signal from the phase splitters 14 and 16 is coupled to a respective multiplier 18, 20 and track-and-hold circuit 22, 24. A control transition signal from a control signal source 26 in the form of a trigger signal is applied to each track-and-hold 22, 24. The held phase values on the respective track-and-hold circuits 22 and 24 are cross-coupled to the multipliers 20 and 18. The outputs of the multipliers 18 and 20 are summed in summing circuit 28 to generate an output signal with a predetermined phase at a predetermined time relative to the transition.

In operation, the phase startable clock device generates a constant value at the output from the summing circuit 28 when the track-and-hold circuits 22 and 24 are tracking the phase shifted sinusoidal signals of the oscillator 12. When a trigger transition occurs, the track-and-hold circuits 22 and 24 hold the phase values of the phase shifted sinusoidal signals. The phase values captured at the time of the trigger event are applied to the multipliers 18 and 20 which generate weighted sinusoidal signals based on these phase values. The weighted sinusoidal signals are added together in the summing circuit to produce the output signal whose phase is constant with respect to the trigger event. The output of the phase startable clock device is used as a coarse time delay for a strobe generator (not shown) to generate a strobe pulse that is applied to a sampler circuit to sample an input signal under test at an instant in time.

Gain, offset and leakage errors in the track-and-hold circuits 22 and 24 cause the held phase values to vary over time. This alters the phase-time relationship of the output signal relative to the transition. As a result, the coarse time delay for the strobe generator will vary producing timing errors in the resultant strobe pulses to the sampler. What is needed is a phase startable clock device that maintains the desired phase-time relationship to a transition signal resulting in a stable clock output.

SUMMARY OF THE INVENTION

Accordingly, the present invention is to an apparatus for generating a phase stable clock signal having at least first and second track-and-hold circuits, first and second multiplexers and an infinite track-and hold circuit. The track-and-hold circuits and the multiplexer are incorporated into a phase gate that further include at least first and second multipliers. The track-and hold circuits and the multipliers are coupled to receive respective phase shifted continuous sinusoidal signals. The track-and-hold circuits are coupled to receive a control input signal having a transition between a first state and a second state to capture and hold the respective phase values of the sinusoidal signals. The infinite track-and hold circuit is coupled to receive the phase values from track-and-hold circuits and generates replicas of the phase values. Each multiplexer is coupled to receive the phase value held on one of the track-and-hold circuits and the corresponding replica phase value from the infinite track-and-hold circuit. The multiplexers selectively couple to phase values to the multipliers during a first time period and the replica phase values during a second time period. A summing circuit is coupled to receive respective output signals from the multipliers to generate an output signal with a predetermined startup phase relative to the transition.

The infinite track-and-hold includes at least first and second analog-to-digital converters that are respectively coupled to corresponding first and second digital-to-analog converters. Each analog-to-digital converter is coupled to receive one of the phase values at the output of the first and second track-and-hold circuits and generates a digital value representative of that phase value. Each digital-to-analog converter is coupled to receive one of the digital values from the analog-to-digital converters and generates a replica analog phase value. The apparatus further includes a phase splitter receiving a continuous sinusoidal signal and generating the phase shifted continuous sinusoidal signals. At least first and second summing circuits may be coupled to the respective outputs of the track-and-hold circuits with each summing circuit being coupled to receive an offset correction value. Each of the first and second multipliers, which are preferably four quadrant multipliers, may be coupled to receive a gain control value. The first time period in which the multiplexers couple the track-and-hold phase values to the multipliers is in the range of 10 microseconds. The second time period in which the multiplexers couple the infinite track-and-hold phase values to the multipliers is in the range of greater than 10 microseconds.

The preferred implementation of the apparatus includes a phase splitter coupled to receive the continuous sinusoidal signal and generates first, second, and third phase shifted continuous sinusoidal signals a(t), b(t), and c(t) of predetermined phases. A third track-and-hold circuit is coupled to receive the third phase shifted sinusoidal signal c(t) with the first and second track-and-hold circuits respectively coupled to receive the first and second phase shifted sinusoidal signals a(t) and b(t). The third track-and-hold circuits also receives the control input signal to capture and hold the phase value of the third phase shifted sinusoidal signal. The infinite track-and-hold circuit receives the phase value on the third track-and-hold circuit and generates a replica of that phase value as well. A third multiplexer is coupled to receive the phase value held on the third track-and-hold circuit and the replica phase value from the infinite track-and-hold circuit. The third multiplexer selectively couples the phase value to the third multiplier during a first time period and the replica phase value during a second time period. The first multiplier multiplies the first phase shifted sinusoidal by b(T)−c(T) to produce a first product signal, the second multiplier multiplies the second phase shifted sinusoidal by c(T)−a(T) to produce a second product signal and the third multiplier multiplies the third phase shifted sinusoidal signal by a(T)–b(T) to produce a third product signal. The summing circuit receives the respective product signals from the multipliers to generate the output signal wherein a(T), b(T) and c(T) are the values of the first, second and third phase shifted sinusoidal signals at the time of the transition. The predetermined phases are preferably of the first, second and third phase shifted sinusoidal signals are 0°, 120°, and 240° respectively.

The objects, advantages and novel features of the present invention are apparent from the following detailed description when read in conjunction with the appended claims and attached drawings.

BRIEF DESCRIPTION OF THE DRAWING FIGURES

DETAILED DESCRIPTION OF THE PREFERRED EMBODIMENT

In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

Part of the description will be presented in terms of operations performed by a digitizing instrument, using terms such as data, values, signal samples, numbers and the like, consistent with the manner commonly employed by those skilled in the art to convey the substance of their work to others skilled in the art. As is well understood by those skilled in the art, these quantities take the form of electrical, magnetic, or optical signals capable of being stored, transferred, combined and otherwise manipulated through mechanical and electrical components of the digitizing instrument; and the term digitizing instrument includes general purpose as well as special purpose data processing machines, systems, and the like, that are stand alone, adjunct or embedded.

Additionally, various operations will be described as multiple discrete steps in turn in a manner that is most helpful in understanding the present invention, however, the order of description should not be construed as to imply that these operations are necessarily order dependent, in particular, the order of their presentation.

Figure 1:
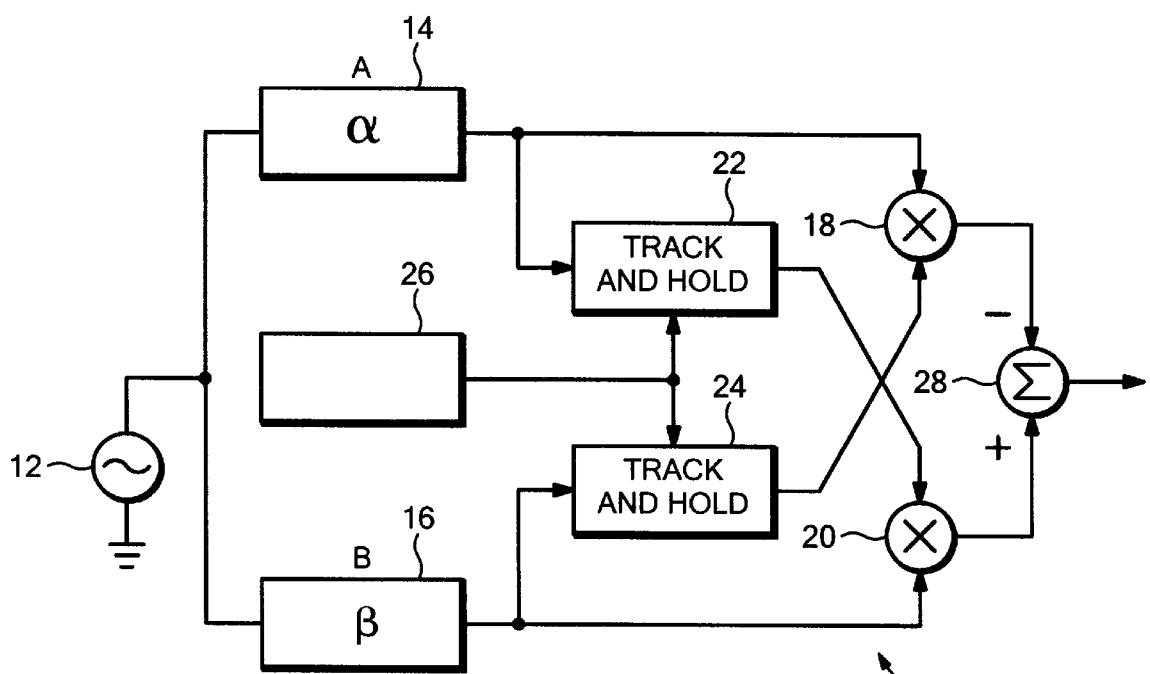
FIG. 1 is a block diagram of a generalized prior art phase startable clock device.
Figure 2:
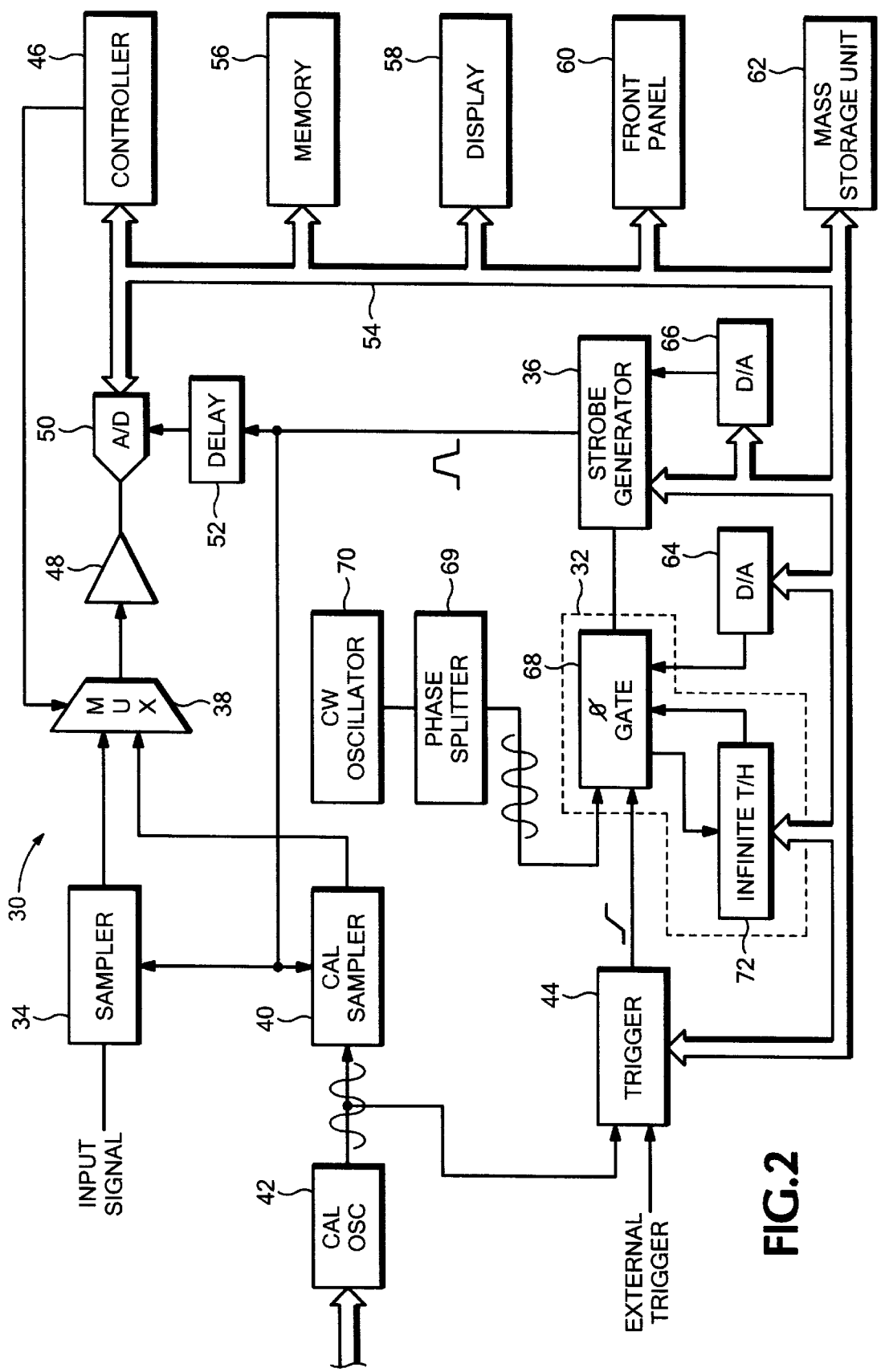
FIG. 2 is a block diagram of a digitizing instrument incorporating the phase startable clock device having improved stability according to the present invention.

Referring to FIG. 2, there is shown a representative block diagram of a digitizing instrument 30 incorporating the phase startable clock device 32 of the present invention. A sampler 34 receives an optical or electrical input signal. The input signal is coupled to sampling diodes within the sampler 34 that sample the signal in response to a sampling strobe from a strobe generator 36. The sampler 34 may include strobe shaping circuitry that shapes the strobe pulses and generates differential strobe pulses. A track-and-hold circuit within the sampler 34 holds the sampled signal. The sampled signal is coupled to one input of a multiplexer (MUX) 38. A second input to the MUX 38 receives a held sampled output of a calibration sampler 40. The calibration sampler 40 receives a signal input from a programmable calibration oscillator 42 that is coupled to a sampling bridge in the calibration sampler 40. The sampling bridge is strobed by strobe pulses from the strobe generator 36 with the sampled oscillator input being held by a track-and-hold circuit. As with the sampler 34, the calibration sampler 40 may include strobe shaping circuitry that shapes the strobe pulses and generates differential strobe pulses. Alternately, the strobe generator 36 may include the shaping and differential circuitry for the strobe pulses. The calibration oscillator 42 output is also coupled to an input of a trigger circuit 44.

The MUX 38 receives control signals from a controller 46 that selectively couples the held input signal samples or the held calibration signal samples to a buffer amplifier 48 via the MUX output. The buffer amplifier 48 conditions the samples for input to an analog-to-digital (A/D) converter 50. The A/D converter 50 is clocked by digitizing strobes generated by the strobe generator 36 and applied to the A/D converter 50 via a delay circuit 52. The digitized samples at the output of the A/D converter 50 are coupled to a system bus 54 and stored in system memory 56 for further processing and displaying.

System memory 56 includes both RAM, ROM and cache memory with the RAM memory storing volatile data, such as the digitized values representative of the input signal, phase values from the phase startable clock device, look-up tables and the like. The system bus 54 couples memory 56 to the controller 46, such as PENTIUM® or Celeron™ microprocessor, manufactured and sold by Intel, Corp., Santa Clara, Calif. The system bus 54 is also coupled to a display device 58, such a liquid crystal display, cathode ray tube or the like, and front panel controls 60 with buttons, rotatable knobs and the like and/or control entry devices, such as a keyboard and/or mouse. A mass storage unit or units 62, such as a hard disk drive, a CD ROM drive, a tape drive, a floppy drive or the like, that reads from and/or writes to appropriate mass storage media, may also be connected to the system bus 54. Program instructions that control the functions of the digitizing instrument may be stored and accessed from the ROM memory 56 or from the mass storage media of the mass storage unit 62. The digitizing instrument 30 in the preferred embodiment of the invention is a PC based system controlled under WINDOWS® 98 operating system, manufactured and sold by Microsoft, Corp., Redmond, Wash. Controller 46 in the block diagram is representative of multiple controller used in the digitizing instrument 30. A separate controller is used to control the acquisition of digitized samples, with DSP controllers processing the signal samples and passing the processed samples to the control processor for display on display device 58.

The system bus 54 is also coupled to the trigger circuit 44, the phase startable clock device 32 and digital-to analog (D/A) converters 64 and 66. The trigger circuit 44 is also coupled to receive an external trigger signal in addition to the calibration oscillator output signal. The trigger circuit 44 selectively couples under program control the trigger input signal or the calibration oscillator signal to the phase startable clock device 32. A phase gate 66 in the phase startable clock device 32 receives the output from the trigger circuit 44. The edges of the trigger circuit output signal drive track-and-hold circuitry in the phase gate 68. The phase gate 68 also receives a phase shifted sinusoidal input signals from a phase splitter 69. The phase splitter 69 is coupled to receives a sinusoidal input from a continuous wave oscillator 70. An infinite track-and-hold circuit 72 receives phase values from the phase gate 68 and couples replicas of the phase values back to the phase gate 68. The D/A converter 64 is coupled to the phase gate 68 to provide offset and gain correction values to the phase startable clock device 32. In the preferred embodiment, the gain and offset correction values are provided by separate D/A converters.

The phase startable clock device 32 generates an output signal having a predetermined startup phase relative to the trigger input signal. The output signal is conditioned as a clock signal and coupled to the strobe generator 36 for establishing a coarse time delay relative to the trigger pulse. The controller 46 under program control loads a coarse delay count value into a strobe delay counter in the strobe generator 36. The clock signal increments the count value in the counter until the terminal count is reached where upon a coarse strobe is generated. The coarse strobe from the strobe delay counter is applied to a fine time delay vernier circuit having ramp circuit that generates a ramping output signal equal to the time interval between the coarse clock pulses. The controller 46 generates a fine time delay value that is coupled via the system bus to the D/A converter 66. The D/A converter 66 converts the fine time delay value to an analog value that is applied to the vernier circuit. The analog fine time delay value in conjunction with the vernier ramp circuit and the coarse time delay generates the timed output strobe pulses from the strobe generator 36.

Figure 3:
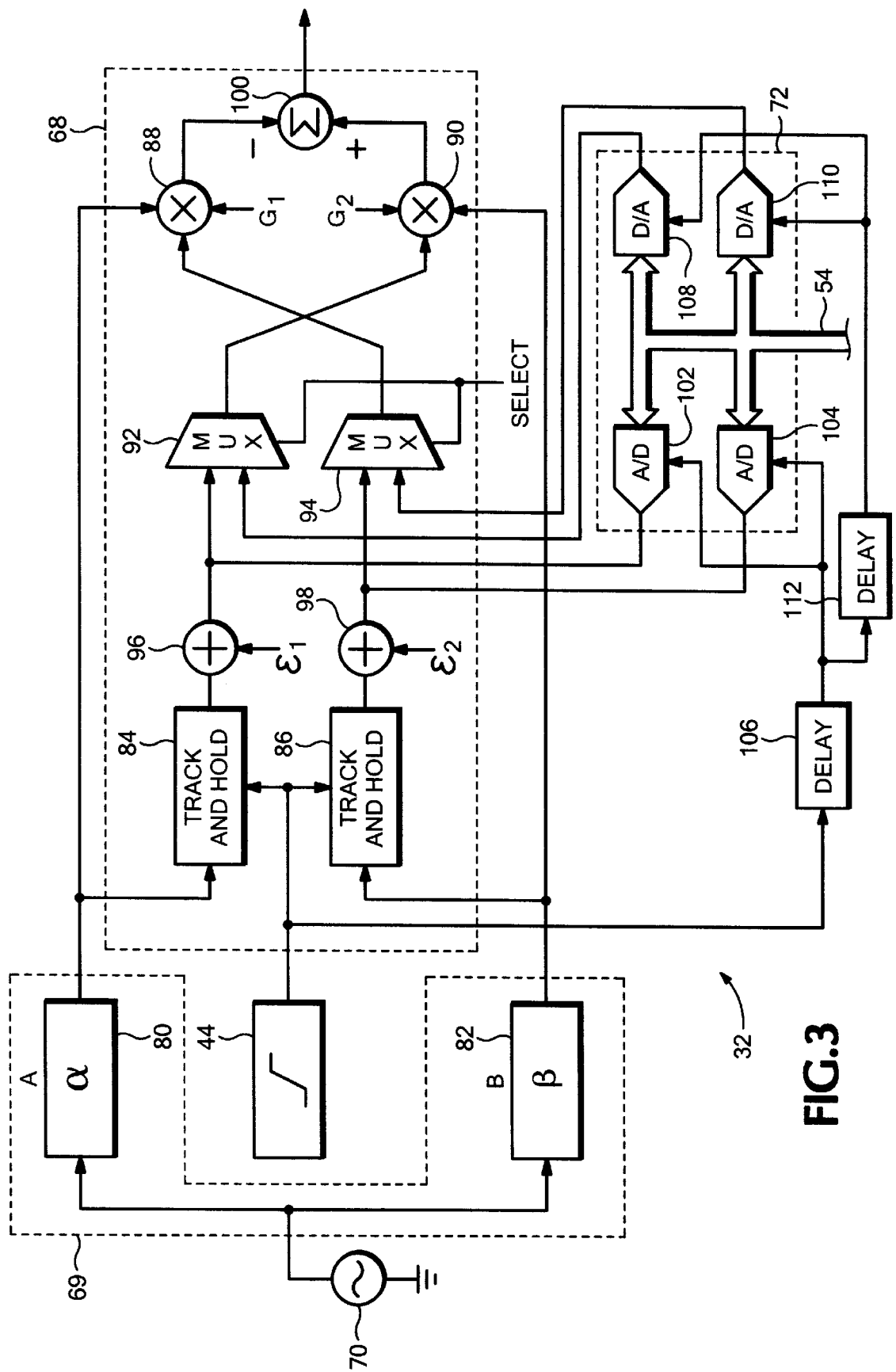
FIG. 3 is a block diagram of the generalized phase startable clock device having improved stability according to the present invention.

FIG. 3 is a block diagram of a generalized embodiment of the phase startable clock device 32 of the present invention. Like elements as illustrated in FIG. 2 are labeled the same. The sinusoidal signal from the continuous wave oscillator 70 is applied to the phase splitter 69 that includes phase shifters 80 and 82. The phase shifter 80 has a gain of A and imposes a phase shift α, and the phase shifter 82 has a gain of B and imposes a phase shift β. The phase difference between phase shifted sinusoidal signals is approximately in quadrature phase but need not be exactly 90° apart for the invention to work. Neither do the gains need to be are exactly equal for the invention to work. The phase shifted sinusoidal signal are respectively applied to track-and-hold circuits 84 and 86 and multiplier circuits 88 and 90 in phase gate 68. The track-and-hold circuits 84 and 86 receive a control input signal from the trigger circuit 44. Summing circuits 96 and 98 are coupled to the respective outputs of track-and-hold circuits 84 and 86 for providing offset correction values to the track-and-hold outputs. The offset corrected outputs of the track-and-hold circuits 84 and 86 are applied to the infinite track-and-hold circuit 72. The offset corrected track-and-hold outputs are also applied to respective first inputs of multiplexers 92 and 94. The second inputs to the multiplexers 92 and 94 are applied from the infinite track-and-hold 72. The multiplexers 92 and 94 selectively couple the offset corrected outputs of the track-and-hold circuits 84 and 86 or the outputs of the 72 infinite track-and-hold circuit to the multipliers 88 and 90 in response to a select signal coupled from the controller 46. The output of multiplexer 92 is applied to the multiplier 90 and the output of multiplexer 94 is applied to multiplier 88. Cross-multiplying the in-phase and quadrature signals eliminates the effects of amplitude and phase errors in the phase shifted output signals of the phase shifters 80 and 82. The multipliers 88 and 90, which in the preferred embodiment are four-quadrant multiplier circuits, multiply their phase shifted sinusoidal inputs with the received phase values from the multiplexers. Each multiplier further receives a gain correction value. The output signals from multipliers 88 and 90 are coupled to a summation circuit 100 that sums the outputs together to produce an output signal having a predetermined startup phase relative to the trigger transition.

The infinite track-and hold circuit 72 receives the respective outputs of track-and-hold circuits 84 and 86. Each track-and-hold output is coupled to an analog-to digital (A/D) converter 102, 104 that may be clocked by the output of the trigger circuit 44 after an appropriate amount of delay as represented by delay 106. The A/D converters digitize the input analog values representative of the phase values held on the track-and-holds 84 and 86 to digital values. The output of each A/D converter 102, 104 is coupled to the system bus 54. The system bus 54 is also coupled to digital-to-analog (D/A) converters 108, 110, which receive the digitized phase values from the respective A/D converters 102, 104. The digitized values are loaded into the D/A converters 108 and 110 in response to a clock signal that may be clocked by the output of the trigger circuit after an appropriate amount of delay as represented by delay 112. The D/A converters convert the digitized values to analog values that are replicas of the analog values on the track-and-hold circuits 84 and 86. Alternately, the digitized values from A/D converters 102 and 104 may be stored in memory 56 for further processing.

The phase shifted sinusoidal outputs of the phase shifters 80 and 82 are given by:

$$A \cos(\omega t + \alpha) \tag{1}$$

$$B \cos(\omega t + \beta) \tag{2}$$

respectively. It is understood that one or the other of the phase shifters 80 and 82 may produce of zero phase shift. The delays in the track-and-holds 84 and 86 are lumped in the delays α and β. Assuming that the track-and-hold circuits impose a phase delay of δ, the output signals of the track-and-hold circuits 84 and 86 in the tracking state are given by:

$$e_1 + A \cos(\omega t + \alpha - \delta) \tag{3}$$

$$e_2 + B \cos(\omega t + \beta - \delta) \tag{4}$$

respectively where $e_1$ and $e_2$ are offset errors. Each circuit path produces a small offset voltage that needs to be removed prior to the application of the phase values to the respective multiplier 88 and 90. Offset correction values are applied to each of the outputs of the track-and-hold circuits 84 and 86 via the summing circuits 96 and 98. In the preferred embodiment, the summing circuits are resistors. Other type of summing circuits well known to those skilled in the art may equally be employed in the design of the phase gate 68. Generally, one of the track-and hold-outputs is used as a reference for the other with the offset correction value referenced to ground potential. The inputs to the multipliers 88 and 90 are respectively given by:

$$(\epsilon_1 + e_1 + B \cos(\omega t + \beta - \delta)) \times A \cos(\omega t + \alpha) \tag{5}$$

$$(\epsilon_2 + e_2 + A \cos(\omega t + \alpha - \delta)) \times B \cos(\omega t + \beta) \tag{6}$$

where $\epsilon_1$ and $\epsilon_2$ are the offset correction values. The gain through each circuit path may not be equal requiring gain correction. Each multiplier 88 and 90 receives a gain correction value that corrects for gain variations in the signal paths. As with the offset correction values, one of the multipliers is set as the reference and a gain correction value is applied to the other multiplier. The gain correction values may be a set of values derived during calibration of the digitizing instrument 30 and stored in memory 56. In the preferred embodiment of the invention, the gain values are dynamically calculated using the reference oscillator 42 and sampler 40. The outputs of the multipliers 88 and 90 are applied to the summation circuit 100, which provides the output in the tracking mode:

$$(\epsilon_1+e_1+B\cos(\omega t+\beta-\delta))\times A\cos(\omega t+\alpha)\cdot G_1+(\epsilon_2+e_2+A\cos(\omega t+\alpha-\delta))\times B\cos(\omega t+\beta)\cdot G_2 \quad (7)$$

where $G_1=G_2=G$ and $\epsilon_1+e_1=0$, $\epsilon_2+e_2=0$ which simplifies to:

$$ABG\sin(\delta)\cdot\sin(\alpha-\beta) \quad (8)$$

The output of the summation circuit with the track-and-hold circuits in the tracking mode is a constant.

The track-and-hold circuits 84 and 86 transition to the enable state at time t=T with the application of a trigger signal from the trigger circuit 44. The track-and hold circuits 84 and 86 hold the phase values of the phase shifted sinusoidal signals in the enable state. The offset correction values are applied via the summing circuits 96 and 98 to the held outputs of the track-and-holds 84 and 86. The offset corrected phase value held on the track-and-hold circuit 84 is coupled to the first input port of MUXs 92 and to the input of A/D converter 102 in the infinite track-and-hold circuit 72. The offset corrected phase value held on the track-and-hold circuit 86 is coupled to the first input port of MUXs 94 and to the input of A/D converter 104 in the infinite track-and-hold 72. The offset corrected phase values are digitized by the A/D converter 102, 104 and stored in memory 56. The digitized phase values are read out of memory and applied to the respective inputs of D/A converters 108 and 110. The D/A converter 108 and 110 convert the digitized phase values to analog values that replicate the offset corrected phase values held by the track-and-holds 84 and 86. The replicated analog values are respectively coupled to the second input ports of the MUXs 92 and 94. The held phase values at the first input ports of MUXs 92 and 94 are initially coupled to their output ports by the select signal applied by the controller 46. The offset corrected phase values are cross-coupled to the multipliers 88 and 90 and multiplied with the phase shifted sinusoidal signals applied from the phase shifters 80 and 82. The respective sinusoidal output signals from the multipliers 88 and 90 are coupled to the summation circuit 100. The analog output signal of the summation circuit 100 in the hold mode with the hold mode entered at t=T is given by:

$$-(\epsilon_1+e_1+B\cos(\omega T+\beta-\delta))\times A\cos(\omega t+\alpha)\cdot G_1+(\epsilon_2+e_2+A\cos(\omega T+\alpha-\delta))\times B\cos(\omega t+\beta)\cdot G_2 \quad (9)$$

where $G_1=G_2=G$ and $\epsilon_1+e_1=0$, $\epsilon_2+e_2=0$ which simplifies to:

$$ABG\sin(\alpha-\beta)\cdot\sin(\omega(t-T)+\delta) \quad (10)$$

Each track-and-hold circuits 84 and 86 hold their respective phase value on a capacitor that has a tendency to discharge over time. Changes in the held value affect the output of the phase gate, which in turn affects the timing accuracy of the strobe pulses, which in turn affects the timing accuracy of the signal samples of the input signal. The infinite track-and-hold 72 provides stable replicas of the held offset corrected phase values from the track-and-hold circuits 84 and 86 to the multiplexers 92 and 92. Initially, the first input ports of the multiplexers 92 and 94 are coupled to their respective output ports. After a selected period of time from the trigger signal transition, the multiplexers are transitioned to their respective second input ports by the application of the select signal from the controller 46. In the preferred embodiment of the invention, the transition occurs in the range of 10 μs but other transition times may be used without departing from the scope of the present invention. The replica offset corrected phase values from the infinite track-and-hold are held at their respective values at the transition time until the time base is reset for the next trigger edge. The offset corrected phase values from the second multiplexer ports are applied to the multiplexers 88 and 90.

The present invention is not restricted to the phase splitter providing only two output signals, and it is applicable to phase splitters having any number of output phases. By way of example, FIG. 4 shows a phase startable clock device in which the sinusoidal signal from the continuous wave oscillator 70' is split into three phases which are then processed and recombined.

Figure 4:
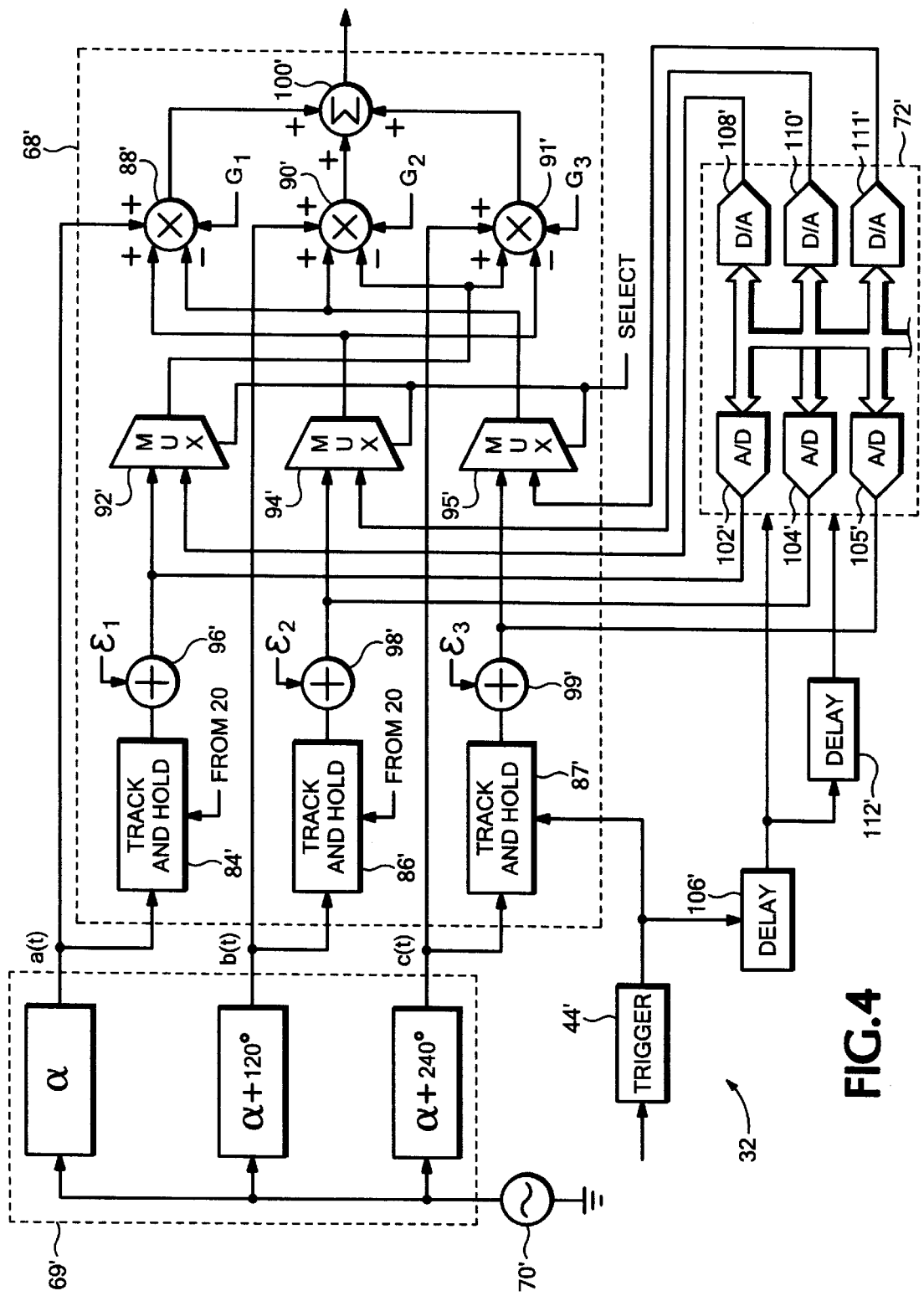
FIG. 4 is a block diagram of the preferred embodiment of the phase startable clock device according to the present invention.

In the device shown in FIG. 4, the continuous wave oscillator 70' is coupled to a three-phase-splitter 69'. The phase splitter 69' produces three output signals a(t), b(t) and c(t) at its outputs. The output signals are separate in phase from each other by approximately 120°. As was previously stated, the phase differences between the phase shifted sinusoidal signals need not be exactly the same for the invention to work. The first output of the phase splitter a(t) is applied to track-and-hold 84' and to the continuous input of the multiplier 88'. The second output b(t) is applied to track-and-hold 86' and to the continuous input of the multiplier 90'. The third output c(t) is applied to track-and-hold 87' and to the continuous input of the multiplier 91'. Offset correction values are added to the outputs of the track-and-holds 84, 86 and 87 via the summing nodes 96', 98' and 99'. The offset corrected outputs a'(t), b'(t) and c'(t) of the track-and-holds 84', 86' and 87' are respectively coupled to the first input ports of multiplexers (MUX) 92', 94', and 95' and to the input of the infinite track-and-hold 72'. The second input ports of the multiplexers 92', 94' and 95' are coupled to the output of the infinite track-and-hold 72'. Each multiplier 88', 90' and 91' also has a differential input. The output port of each of the multiplexers 92', 94' and 95' is coupled to two of the differential inputs of the multipliers 88', 90' and 91'. The output port of multiplexer 92' is respectively coupled to the inverting and non-inverting differential inputs of multipliers 90' and 91'. The output port of multiplexer 94' is coupled to the inverting differential input of multiplier 91' and to the non-inverting input of multiplier 88'. The output port of multiplexer 95' is coupled to the non-inverting input of multiplexer 90' and the inverting differential input of multiplier 88'. The offset corrected outputs a'(t), b'(t) and c'(t) of the respective track-and-holds 84', 86' and 87' are applied to the differential inputs of the multipliers 88', 90' and 91' such that the multipliers provided outputs are respectively represented by the below equations.

$$a(t)\times(b'(t)-c'(t))\cdot G_1 \quad (10)$$

$$b(t)\times(c'(t)-a'(t))\cdot G_2 \quad (11)$$

$$c(t)\times(a'(t)-b'(t))\cdot G_3 \quad (12)$$

where $G_1$, $G_2$ and $G_3$ are the gain correction values applied to the multipliers. The three signals are brought together in the summation circuit 100' to produce the output signal:

$$a(t)\times(b'(t)-c'(t))\cdot G_1+b(t)\times(c'(t)-a'(t))\cdot G_2+c(t)\times(a'(t)-b'(t))\cdot G_3 \quad (13)$$

In the tracking mode, ignoring delays in the track-and-holds and taking into account the offset and gain correction values, the functions a'(t), b'(t) and c'(t) are respectively the same as a(t), b(t) and c(t). It can be shown that if the signal a(t) is given by:

$$a(t) = \sin(\omega t + \alpha) \tag{14}$$

the output signal of the summation circuit 100' is a constant. If the transition to the hold state takes place at a time t=T, then a'(t), b'(t) and c'(t) are equal to constants a(T), b(T) and c(T) respectively. It can be shown that the output signal from the summation circuit 100' is directly proportional to:

$$\sin(\omega t - \omega T) \tag{15}$$

The infinite track-and-hold 72' is coupled to receive the offset corrected phase values on the track-and-holds 84', 86' and 87' at A/D converters 102', 104' and 105' respectively. The outputs of the A/D converters 102', 104' and 105' are coupled via bus 54' to the inputs of D/A converters 108', 110' and 111' respectively. As previously stated the A/D and D/A converters may be clocked by the output of the trigger circuit 44' after appropriate delay as represented by delays 106' and 112'. The outputs of the D/A converters 108', 110' and 111' are coupled to the second input ports of multiplexers 92', 94' and 95' respectively. During the tracking mode, the select signal from the controller couples the input ports of the multiplexers 92', 94' and 95' to their respective output ports. When a trigger transition occurs, the track-and-hold circuits 84', 86' and 87' hold the instantaneous phase values of the phase shifted sinusoidal signals a(t), b(t) and c(t). Offset correction values are summed with the phase values and applied to the first input ports of the multiplexers 92', 94' and 95'. The offset corrected phase values a'(t), b'(t) and c'(t) from the multiplexers 92', 94' and 95' to the multipliers 88', 90' and 91'. The output of the multipliers are applied to the summing circuit 100' that generates an output signal with a predetermined startup phase relative to the transition. The output signal is applied to the strobe generator 36 as a coarse time delay increment marker relative to the trigger transition. The phase values held on the track-and-hold circuits 84', 86' and 87' vary over time due to the phase value being held on a capacitor. At a predetermined time interval, the controller 46 issues a multiplexer select command that transitions the output ports of the multiplexers 92', 94' and 95' from the first input ports the second input ports. The second input ports receive the replicated offset corrected phase values from the infinite track-and-hold 72'. In the preferred embodiment, the transition occurs in the range of 10 μsec. For strobe pulses that are delayed beyond 10 μsec, the replicated offset corrected phase values are used to generate the output signal.

An apparatus for generating a phase startable clock signal has been described having at least first and second track-and-hold circuits, first and second multiplexers and an infinite track-and hold circuit. The track-and-hold circuits and the multiplexer are incorporated into a phase gate having at least first and second multipliers and a summing circuit. The track-and hold circuits and the multipliers are coupled to receive respective phase shifted continuous sinusoidal signals. The output of the track-and-hold circuits are coupled to the inputs of the multipliers. The output of the multipliers are coupled to the summing circuit that generates an output signal responsive to a control input signal having a transition between a first state and a second state. During the tracking mode where the transition is in the first state, the output of the summing circuit is constant. During the hold mode where the transition is in the second state, the track-and-hold circuits hold respective phase values of the phase shifted sinusoidal signals. The phase values are coupled to first inputs of the multiplexers and to the input of the infinite track-and-hold. The second inputs to the multiplexers are coupled to receive replicated phase values from the infinite track-and-hold representative of the track-and-hold phase values. The track-and-hold phase values and the replicated phase values are selectively applied from the multiplexers to the multipliers depending on the amount of strobe delay programmed into the digitizing instrument incorporating the invention. The multiplied outputs of the multipliers are summed in the summing circuit to generates an output signal with a predetermined stable startup phase relative to the transition.

The infinite track-and-hold includes at least first and second analog-to-digital converters that are respectively coupled to corresponding first and second digital-to-analog converters. Each analog-to-digital converter is coupled to receive one of the phase values at the output of the first and second track-and-hold circuits and generates a digital value representative of the phase value. Each digital-to-analog converter is coupled to receive one of the digital values from the analog-to-digital converters and generates a replica analog phase value.

It will be obvious to those having skill in the art that many changes may be made to the details of the above-described embodiments of this invention without departing from the underlying principles thereof. The scope of the present invention should, therefore, be determined only by the following claims.

What is claimed is:

1. An apparatus for generating a phase startable clock signal comprising:

a phase gate having at least first and second track-and-hold circuits and first and second multipliers with each track-and-hold circuit and multiplier coupled to receive one of first and second phase shifted continuous sinusoidal signals;

the first and second track-and-hold circuits coupled to receive a control input signal having a transition between a first state and a second state to capture and hold respective phase values of the sinusoidal signals;

an infinite track-and hold circuit coupled to receive the held phase values at the outputs of the track-and-hold circuits and generating replicas of the phase values;

at least first and second multiplexers respectively coupled to receive the phase values held on the first and second track-and-hold circuits and replicas of the respective phase values from the infinite track-and-hold circuit at a transition time;

the first and second multiplexers selectively coupling the phase values to the multipliers during a first time period and the replica phase values during a second time period starting at the transition time; and a summing circuit coupled to receive respective output signals from the multipliers to generate an output signal with a predetermined startup phase relative to the control input signal transition.

2. The apparatus as recited in claim 1 wherein the infinite track-and-hold circuit comprises:

at least first and second analog-to-digital converters with each analog-to-digital converter coupled to receive one of the phase values at the output of the first and second track-and-hold circuits and generating a digital value representative of the phase value; and at least first and second digital-to-analog converters with each digital-to-analog converter coupled to receive one of the digital values from the analog-to-digital converters and generating a replica analog phase value.

3. The apparatus as recited in claim 1 further comprising a phase splitter receiving a continuous sinusoidal signal and generating the phase shifted continuous sinusoidal signals.

4. The apparatus as recited in claim 1 further comprising at least first and second summing circuits with each summing circuit coupled to one of the outputs of the first and second track-and-hold circuits and further coupled to receive a offset correction value.

5. The apparatus as recited in claim 1 wherein the first and second multipliers are each coupled to receive a gain correction value.

6. The apparatus as recited in claim 1 wherein the first and second multipliers are four quadrant multipliers.

7. The apparatus as recited in claim 1 wherein the first time period in which the multiplexers couple the track-and-hold phase values to the multipliers is in the range of less than 10 microseconds.

8. The apparatus as recited in claim 7 wherein the second time period in which the multiplexers couple the infinite track-and-hold phase values to the multipliers is in the range of greater than 10 microseconds.

9. The apparatus as recited in claim 1 further comprising:
a phase splitter coupled to receive a continuous sinusoidal signal and generating first, second, and third phase shifted continuous sinusoidal signals a(t), b(t), and c(t) of predetermined phases;
a third track-and-hold circuit and a third multiplier coupled to receive the third phase shifted sinusoidal signal c(t) with the first and second track-and-hold circuits respectively coupled to receive the first and second phase shifted sinusoidal signals a(t) and b(t) and the third track-and-hold circuit coupled to receive the control input signal to capture and hold a phase value of the third phase shifted sinusoidal signal;
the infinite track-and-hold circuit coupled to receive the phase value at the output of the third track-and-hold circuit and generating a replica of the phase value;
a third multiplexer coupled to receive the phase value held on the third track-and-hold circuit and a replica of the phase value from the infinite track-and-hold circuit at the transition time with the third multiplexer selectively coupling the phase value to the multipliers during a first time period and the replica phase value during a second time period starting at the transition time; and
the first multiplier multiplying the first phase shifted sinusoidal by b(T)–c(T) to produce a first product signal, the second multiplier multiplying the second phase shifted sinusoidal by c(T)–a(T) to produce a second product signal and a third multiplier multiplying the third phase shifted sinusoidal signal by a(T)–b(T) to produce a third product signal with the summing circuit coupled to receive respective product signals from the multipliers to generates the output signal wherein a(T), b(T) and c(T) are the values of the first, second and third phase shifted sinusoidal signals at the time of the transition.

10. The apparatus as recited in claim 9 further comprising first, second and third summing circuits with each summing circuit coupled to one of the outputs of the first, second and third track-and-hold circuits and further coupled to receive an offset correction value.

11. The apparatus as recited in claim 9 wherein the first, second and third multipliers are each coupled to receive a gain correction value.

12. The apparatus as recited in claim 9 wherein the first, second and third multipliers are four quadrant multipliers.

13. The apparatus as recited in claim 9 wherein the predetermined phase of the first, second and third phase shifted sinusoidal signals are 0°, 120°, and 240° respectively.

14. A phase startable clock apparatus comprising:
a phase gate having first, second and third track-and-hold circuits and first, second and multipliers respectively coupled to receive first, second and third phase shifted continuous sinusoidal signals a(t), b(t) and c(t) of predetermined phase;
the track-and-hold circuits coupled to receive a control input signal having a transition between a first state and a second state to capture and hold respective phase values of the sinusoidal signals;
an infinite track-and hold circuit coupled to receive the phase values at the output of the track-and-hold circuits and generating replicas of the phase values;
first, second and third multiplexers respectively coupled to receive the phase values held on the track-and-hold circuits and replicas of the respective phase values from the infinite track-and-hold circuit at a transition time;
the multiplexers selectively coupling the phase values to the multipliers during a first time period and the replica phase values during a second time period starting at the transition time;
the first multiplier multiplying the first phase shifted sinusoidal by b(T)–c(T) to produce a first product signal, the second multiplier multiplying the second phase shifted sinusoidal by c(T)–a(T) to produce a second product signal and a third multiplier multiplying the third phase shifted sinusoidal signal by a(T)–b(T) to produce a third product signal wherein a(T), b(T) and c(T) are the values of the first, second and third phase shifted sinusoidal signals at the time of the transition; and
a summing circuit coupled to receive respective product signals from the multipliers to generates an output signal with a predetermined startup phase relative to the control input signal transition.

15. The phase startable clock apparatus as recited in claim 14 wherein the infinite track-and-hold circuits comprises:
at least first, second and third analog-to-digital converters with each analog-to-digital converter coupled to receive one of the phase values from the first, second and third track-and-hold circuits and generating a digital value representative of the phase value; and
at least first, second and third digital-to-analog converters with each digital-to-analog converter coupled to receive one of the digital values from the analog-to-digital converters and generating a replica analog phase value.

16. The phase startable clock apparatus as recited in claim 14 further comprising a phase splitter receiving a continuous sinusoidal signal and generating the phase shifted continuous sinusoidal signals.

17. The phase startable clock apparatus as recited in claim 14 further comprising at least first, second and third summing circuits with each summing circuit coupled to one of the outputs of the first, second and third track-and-hold circuits and further coupled to receive a offset correction value.

18. The phase startable clock apparatus as recited in claim 14 wherein the multipliers are each coupled to receive a gain correction value.

19. The phase startable clock apparatus as recited in claim 14 wherein the multipliers are four quadrant multipliers.

20. The phase startable clock apparatus as recited in claim 14 wherein the first time period in which the multiplexers couple the track-and-hold phase values to the multipliers is in the range of 10 microseconds.

21. The phase startable clock apparatus as recited in claim 20 wherein the second time period in which the multiplexers couple the infinite track-and-hold phase values to the multipliers is in the range of greater than 10 microseconds.

22. The phase startable clock apparatus as recited in claim 14 wherein the predetermined phase of the first, second and third phase shifted sinusoidal signals are 0°, 120°, and 240° respectively.

* * * * *